(12) United States Patent
Yan (10) Patent No.: US 11,990,379 B2
(45) Date of Patent: May 21, 2024

(54) ARRAY SUBSTRATE, MANUFACTURING METHOD THEREOF, AND SHORT CIRCUIT REPAIR METHOD

(71) Applicant: SHENZHEN CHINA STAR OPTOELECTRONICS SEMICONDUCTOR DISPLAY TECHNOLOGY CO., LTD., Shenzhen (CN)

(72) Inventor: Peijian Yan, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 482 days.

(21) Appl. No.: 17/425,675

(22) PCT Filed: May 24, 2021

(86) PCT No.: PCT/CN2021/095404
§ 371 (c)(1),
(2) Date: Jul. 23, 2021

(87) PCT Pub. No.: WO2022/166036
PCT Pub. Date: Aug. 11, 2022

(65) Prior Publication Data
US 2023/0369138 A1    Nov. 16, 2023

(30) Foreign Application Priority Data
Feb. 5, 2021    (CN) .......................... 202110163566.6

(51) Int. Cl.
*H01L 21/66* (2006.01)
*H01L 27/12* (2006.01)
(Continued)

(52) U.S. Cl.
CPC ............ *H01L 22/20* (2013.01); *H01L 27/124* (2013.01); *H01L 27/1244* (2013.01);
(Continued)

(58) Field of Classification Search
CPC ............... H01L 27/1244; H01L 27/124; H01L 27/1214; H01L 27/1259; H01L 22/20; G02F 1/13259
See application file for complete search history.

(56) References Cited

U.S. PATENT DOCUMENTS

| 2008/0117344 A1 | 5/2008 | Kim et al. |
| 2018/0151372 A1 | 5/2018 | Sie et al. |

(Continued)

FOREIGN PATENT DOCUMENTS

| CN | 1991539 A | 7/2007 |
| CN | 101576691 A | 11/2009 |

(Continued)

OTHER PUBLICATIONS

International Search Report in International application No. PCT/CN2021/095404, dated Oct. 26, 2021.

(Continued)

*Primary Examiner* — Joseph C. Nicely
(74) *Attorney, Agent, or Firm* — PV IP PC; Wei Te Chung; Zhigang Ma (57) ABSTRACT

An array substrate, a manufacturing method thereof, and a short circuit repair method are provided. The array substrate includes at least one switch unit, wherein each of the switch unit includes a first thin film transistor (TFT) set and a second TFT set, a hollow area is disposed on a first metal layer, a semiconductor layer includes a first area corresponding to the first TFT set and a second area corresponding to the second TFT set, and a vertical projection of an area between the first area and the second area on a substrate (Continued)

completely covers a vertical projection of the hollow area on the substrate.

20 Claims, 8 Drawing Sheets

(51) Int. Cl.
*G02F 1/1362* (2006.01)
*G02F 1/1368* (2006.01)

(52) U.S. Cl.
CPC .... *H01L 27/1288* (2013.01); *G02F 1/136259* (2013.01); *G02F 1/1368* (2013.01)

(56) References Cited

U.S. PATENT DOCUMENTS

| | | | |
|---|---|---|---|
| 2019/0006477 A1* | 1/2019 | He | H01L 29/78696 |
| 2019/0086750 A1 | 3/2019 | Han | |
| 2021/0262976 A1 | 8/2021 | Tobjork et al. | |

FOREIGN PATENT DOCUMENTS

| | | |
|---|---|---|
| CN | 102360146 A | 2/2012 |
| CN | 103035636 A | 4/2013 |
| CN | 106206746 A | 12/2016 |
| CN | 207134356 U | 3/2018 |
| CN | 108198863 A | 6/2018 |
| TW | 201506871 A | 2/2015 |
| WO | 2017193454 A1 | 11/2017 |

OTHER PUBLICATIONS

Written Opinion of the International Search Authority in International application No. PCT/CN2021/095404, dated Oct. 26, 2021.
Chinese Office Action issued in corresponding Chinese Patent Application No. 202110163566.6 dated Jun. 30, 2022, pp. 1-9.

* cited by examiner

ARRAY SUBSTRATE, MANUFACTURING METHOD THEREOF, AND SHORT CIRCUIT REPAIR METHOD

RELATED APPLICATIONS

This application is a Notional Phase of PCT Patent Application No. PCT/CN2021/095404 having international filing date of May 24, 2021, which claims the benefit of priority of Chinese Patent Application No. 202110163566.6 filed on Feb. 5, 2021. The contents of the above applications are all incorporated by reference as if fully set forth herein in their entirety.

FIELD OF INVENTION

The present application relates to the field of display technology, and especially to an array substrate, a manufacturing method thereof, and a short circuit repair method.

BACKGROUND OF INVENTION

With development of display technology, thin film transistor liquid crystal displays (TFT-LCDs) have advantages such as high definition, power saving, thin body, and wide application range, and therefore are widely applied to various consumer electronics.

Gate driver on array (GOA) technology and mini light-emitting diodes (mini LEDs) have increasingly been widely applied to liquid crystal displays, and in order to achieve higher charge rate and satisfy high current requirement of switch units, GOA and mini LED technology often adopt a plurality of TFT parallel structures as switch units. Using a GOA circuit as an example, a GOA unit is connected to a sub-pixel unit in an array substrate through a switch unit to drive the sub-pixel unit to emit light and display. For this category of switch units, when a short circuit occurs among a same layer of metal, it can be repaired and the entire switch units can still work. When a short circuit occurs between two stacked metal layers, it is required to use laser to disconnect part of a second metal layer on two sides of a short circuit defect point and repair the short circuit defect point between a first metal layer and the second metal layer. However, because laser has to be irradiated from under the first metal layer, the first metal layer is susceptible to the laser, such that a defect point that causes a short circuit cannot be repaired, causing lower yield and even causing entire switch units to be scrapped.

In summary, it is in urgent need to provide an array substrate, a manufacturing method thereof, and a short circuit repair method to solve the above-described technical problem.

SUMMARY OF INVENTION

The present application provides an array substrate, a manufacturing method thereof, and a short circuit repair method to solve a technical problem that, in a conventional array substrate, when a short circuit occurs between two stacked metal layers, the short circuit cannot be repaired, causing lower yield and even causing entire switch units to be scrapped.

In order to solve the above-described problems, the present application provides following technical approach:

The present application provides an array substrate that includes a substrate and at least one switch unit disposed on the substrate, wherein each of the switch unit includes a plurality of thin film transistors (TFTs) in parallel, and each of the switch unit includes at least two columns of a first TFT set and at least two columns of a second TFT set; wherein a first metal layer, a gate insulation layer, a semiconductor layer, and a second metal layer are sequentially disposed on the substrate, a hollow area is defined in the first metal layer, the semiconductor layer includes a first area corresponding to the first TFT set and a second area corresponding to the second TFT set, and a vertical projection of an area between the first area and the second area on the substrate completely covers a vertical projection of the hollow area on the substrate.

The array substrate according to the present application, the first metal layer includes at least a gate of the TFTs, and the second metal layer includes at least a first connection wiring, a second connection wiring, a source of the TFTs, and a drain of the TFTs; wherein the source of the plurality of TFTs of the first TFT set is connected through the first connection wiring, and the drain of the plurality of TFTs of the second TFT set is connected through the second connection wiring.

The array substrate according to the present application, there is a first gap between one side of a vertical projection of the first connection wiring on the substrate close to the first area and one side of a vertical projection of the hollow area on the substrate close to the first area; wherein there is a second gap between one side of a vertical projection of the first connection wiring on the substrate close to the second area and one side of a vertical projection of the hollow area on the substrate close to the second area.

The array substrate according to the present application, a range of the first gap is 4 um-6 um, and a range of the second gap is 4 um-6 um.

The array substrate according to the present application, one side of a vertical projection of the first area on the substrate close to the second area coincides with one side of a vertical projection of the hollow area on the substrate close to the first area; wherein one side of a vertical projection of the second area on the substrate close to the first area coincides with one side of a vertical projection of the hollow area on the substrate close to the second area.

The array substrate according to the present application, the gate insulation layer is filled in the hollow area.

The present application provides a manufacturing method of an array substrate, including following steps:

Providing a substrate; forming a first metal layer on the substrate; etching the first metal layer to form a hollow area; forming a gate insulation layer on the first metal layer; forming a semiconductor layer on the gate insulation layer, wherein the semiconductor layer includes a first area and a second area, and a vertical projection of an area between the first area and the second area on the substrate completely covers a vertical projection of the hollow area on the substrate; and forming a second metal layer on the semiconductor layer; wherein the first metal layer, the gate insulation layer, the semiconductor layer, and the second metal layer together become at least one switch unit, each of the switch unit includes a plurality of thin film transistors (TFTs) in parallel, and each of the switch unit includes at least two columns of a first TFT set and at least two columns of a second TFT set.

The present application provides the manufacturing method of the array substrate, wherein etching the first metal layer to form the hollow area includes following steps: forming a photoresist layer on the first metal layer; performing exposure and development to the photoresist layer; and performing etching to the first metal layer to form the hollow area.

The present application provides the manufacturing method of the array substrate, wherein the first metal layer includes at least a gate of the TFTs, and the second metal layer includes at least a first connection wiring, a second connection wiring, a source of the TFTs, and a drain of the TFTs; wherein the source of the plurality of TFTs of the first TFT set is connected through the first connection wiring, and the drain of the plurality of TFTs of the second TFT set is connected through the second connection wiring.

The present application provides the manufacturing method of the array substrate, wherein there is a first gap between one side of a vertical projection of the first connection wiring on the substrate close to the first area and one side of a vertical projection of the hollow area on the substrate close to the first area; wherein there is a second gap between one side of a vertical projection of the first connection wiring on the substrate close to the second area and one side of a vertical projection of the hollow area on the substrate close to the second area.

The present application provides the manufacturing method of the array substrate, wherein a range of the first gap is 4 um-6 um, and a range of the second gap is 4 um-6 um.

The present application provides the manufacturing method of the array substrate, wherein one side of a vertical projection of the first area on the substrate close to the second area coincides with one side of a vertical projection of the hollow area on the substrate close to the first area; wherein one side of a vertical projection of the second area on the substrate close to the first area coincides with one side of a vertical projection of the hollow area on the substrate close to the second area.

The present application provides the manufacturing method of the array substrate, wherein the gate insulation layer is filled in the hollow area.

The present application provides a short circuit repair method of an array substrate, including following steps: providing an array substrate, wherein the array substrate includes a substrate and at least one switch unit disposed on the substrate, wherein each of the switch unit includes a plurality of thin film transistors (TFTs) in parallel, and each of the switch unit includes at least two columns of a first TFT set and at least two columns of a second TFT set; wherein a first metal layer, a gate insulation layer, a semiconductor layer, and a second metal layer are sequentially disposed on the substrate, a hollow area is defined in the first metal layer, the semiconductor layer includes a first area corresponding to the first TFT set and a second area corresponding to the second TFT set, and a vertical projection of an area between the first area and the second area on the substrate completely covers a vertical projection of the hollow area on the substrate; detecting the array substrate using an array test machine to find a short circuit defect point in the array substrate and a dysfunctional TFT corresponding to the defect point, and recording a position coordinate of the defect point; according to the position coordinate of the defect point, a laser repair machine finding the defect point and the corresponding dysfunctional TFT; and locating laser at a first cutting point and a second cutting point on two sides of the defect point to disconnect the dysfunctional TFT, wherein the first cutting point and the second cutting point are located in the second metal layer, and a vertical projection of the second cutting point on the substrate is in a vertical projection of the hollow area on the substrate.

According to the short circuit repair method of the array substrate of the present application, a vertical projection of the first cutting point on the substrate does not coincide with a vertical projection of the first metal layer on the substrate.

According to the short circuit repair method of the array substrate of the present application, the first metal layer includes at least a gate of the TFTs, and the second metal layer includes at least a first connection wiring, a second connection wiring, a source of the TFTs, and a drain of the TFTs; wherein the source of the plurality of TFTs of the first TFT set is connected through the first connection wiring, and the drain of the plurality of TFTs of the second TFT set is connected through the second connection wiring.

According to the short circuit repair method of the array substrate of the present application, there is a first gap between one side of a vertical projection of the first connection wiring on the substrate close to the first area and one side of a vertical projection of the hollow area on the substrate close to the first area; wherein there is a second gap between one side of a vertical projection of the first connection wiring on the substrate close to the second area and one side of a vertical projection of the hollow area on the substrate close to the second area.

According to the short circuit repair method of the array substrate of the present application, a range of the first gap is 4 um-6 um, and a range of the second gap is 4 um-6 um.

According to the short circuit repair method of the array substrate of the present application, one side of a vertical projection of the first area on the substrate close to the second area coincides with one side of a vertical projection of the hollow area on the substrate close to the first area; wherein one side of a vertical projection of the second area on the substrate close to the first area coincides with one side of a vertical projection of the hollow area on the substrate close to the second area.

According to the short circuit repair method of the array substrate of the present application, the gate insulation layer is filled in the hollow area.

Beneficial effects of the present application are that the array substrate, manufacturing method thereof, and short circuit repair method according to embodiments of the present application, through defining a hollow area in a first metal layer, wherein a semiconductor layer includes a first area corresponding to a first TFT set and a second area corresponding to a second TFT set, and the hollow area is disposed at least corresponding to part of an area between the first area and the second area, when there is a short circuit between the first metal layer and a second metal layer, because there is no first metal layer at the hollow area, laser can disconnect part of the second metal layer on two sides of a short circuit defect point through the hollow area from under the first metal layer, the short circuit defect point between the first metal layer and the second metal layer can be repaired, and an entire switch unit can continue to work, thereby alleviating loss of yield.

DESCRIPTION OF DRAWINGS

The accompanying figures to be used in the description of embodiments of the present application will be described in brief to more clearly illustrate the technical solutions of the embodiments. The accompanying figures described below are only part of the embodiments of the present application, from which figures those skilled in the art can derive further figures without making any inventive efforts.

DETAILED DESCRIPTION OF EMBODIMENTS

Following description of various embodiments illustrates specific embodiments of the present disclosure with reference to accompanying drawings. Orientational terms mentioned in the present disclosure such as "top", "bottom", "front", "rear", "left", "right", "inside", "outside", "side", etc. merely indicate directions with respect to the accompanying drawings. Therefore, orientational terms are used to describe and for understanding the present disclosure, and not intended to limit the present disclosure. In the drawings, units of similar structures are denoted by same reference numerals.

The present application is directed to a conventional array substrate, manufacturing method thereof, and short circuit repair method. In conventional technology, when a short circuit occurs between two stacked metal layers, the short circuit cannot be repaired, causing lower yield and even causing entire switch units to be scrapped, and the present application can solve this drawback.

Figure 1:
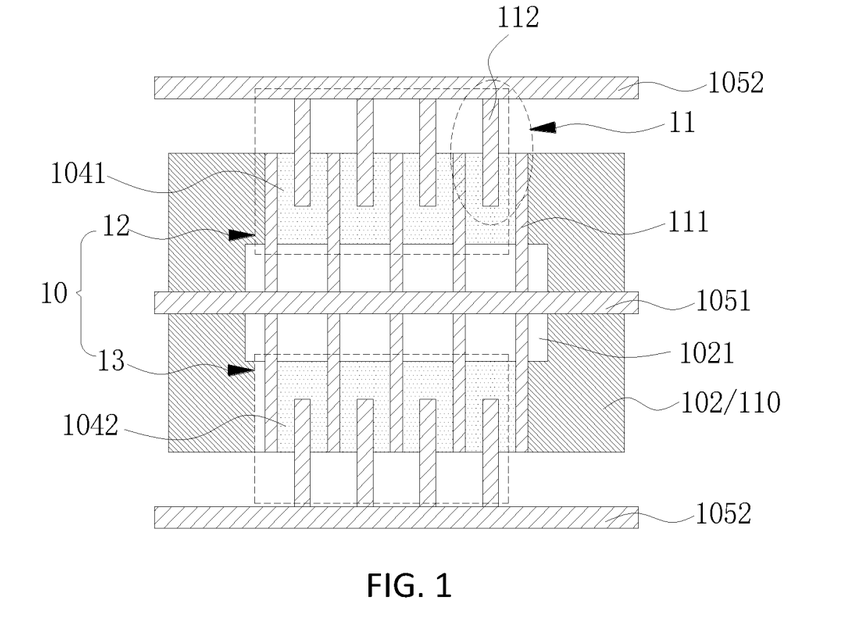
FIG. 1 is a top view of an array substrate according to a first embodiment of the present application.
Figure 2:
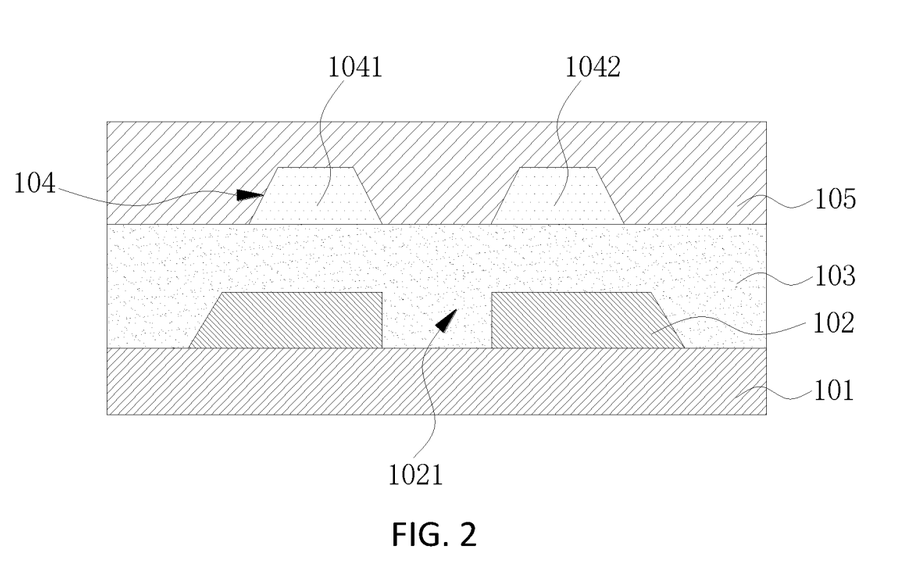
FIG. 2 is a sectional view of the array substrate according to the first embodiment of the present application.

Referring to FIG. 1 and FIG. 2, FIG. 1 is an array substrate according to the present application, including a substrate 101 and at least one switch unit 10 disposed on the substrate 101, wherein each of the switch unit 10 includes a plurality of thin film transistors (TFTs) 11 in parallel, and each of the switch unit 10 includes at least two columns of a first TFT set 12 and at least two columns of a second TFT set 13.

A first metal layer 102, a gate insulation layer 103, a semiconductor layer 104, and a second metal layer 105 are sequentially disposed on the substrate 101, and each of the TFTs 11 at least consists of the first metal layer 102, the gate insulation layer 103, the semiconductor layer 104, and the second metal layer 105. A hollow area 1021 is defined in the first metal layer 102, the semiconductor layer 104 includes a first area 1041 corresponding to the first TFT set 12 and a second area 1042 corresponding to the second TFT set 13, and a vertical projection of an area between the first area 1041 and the second area 1042 on the substrate 101 completely covers a vertical projection of the hollow area 1021 on the substrate 101.

It should be explained that when there is a defect point in film layers between the first metal layer 102 and the second metal layer 105, such as a particle or a hole (metal material of the second metal layer 105 flowing into the hole), it causes a short circuit of the first metal layer 102 and the second metal layer 105. Using a defect point of a particle as an example to explain, when the particle exists simultaneously at the first area 1041 of the semiconductor layer 104 and the gate insulation layer 103, it causes one of the TFTs 11 to be dysfunctional, and because the semiconductor layer 104 is disposed at the entire first area 1041, one dysfunctional TFT 11 causes all other TFTs 11 of the first TFT set 12 to be unable to work, thereby causing the entire switch unit 10 broken. Furthermore, when only disconnection at one end of the dysfunctional TFT 11 can be done, repair cannot be realized.

It can be understood that, in embodiments of the present application, there is no first metal layer 102 at the hollow area 1021, two ends of the dysfunctional TFT 11 can both be disconnected, and part of the second metal layer 105 on a surface on two sides of the defect point can be disconnected, such that repair of a short circuit defect point between the first metal layer 102 and the second metal layer 105 can be realized, and the entire switch unit 10 can continue to work, thereby alleviating loss of yield.

In embodiments of the present application, the first TFT set 12 includes a plurality of first TFTs, the second TFT set 13 includes a plurality of second TFTs, the plurality of first TFTs are in parallel with the plurality of second TFTs, each of the first TFTs is disposed opposite to one of the second TFTs, and a number of the first TFTs is equal to a number of the second TFTs.

The first metal layer 102 includes at least a gate 110 of the TFTs 11, and the second metal layer 105 includes at least a first connection wiring 1051, a second connection wiring 1052, a source 111 of the TFTs 11, and a drain 112 of the TFTs 11. The source 111 of the plurality of first TFTs of the first TFT set 12 is connected through the first connection wiring 1051, and the drain 112 of the plurality of second TFTs of the second TFT set 13 is connected through the second connection wiring 1052, so that the plurality of TFTs 11 of the switch unit 10 realize a parallel connection.

When the switch unit 10 is applied to a gate driver on array (GOA) circuit, the switch unit 10 is located at a GOA area of a display panel, two connection terminals of the switch unit 10 are separately connected to a GOA unit and a scan line, the scan line is connected to a sub-pixel of a display area of the display panel, configured to control on and off of each sub-pixel, and a control terminal of the switch unit 10 is connected to a driving integrated circuit. Specifically, the gate 110 of the first TFTs and the gate 110 of the second TFTs are connected to the driving integrated circuit to obtain a partial display signal and a clock signal. The gate controls a time each scan line is turned on by the GOA unit according to the clock signal, sets control voltage corresponding to each scan line according to the partial display signal, and outputs a control voltage corresponding to a scan line to the switch unit 10 corresponding to the scan line at an activation time of the scan line to control on or off of the scan line. The first connection wiring 1051 is connected to a corresponding GOA unit, and the second connection wiring 1052 is connected to a corresponding scan line. Because these are conventional technology, detailed description is omitted here.

The gate insulation layer 103 is filled in the hollow area 1021 to achieve planarization of the first metal layer 102.

Furthermore, the hollow area 1021 can completely correspond to the area between the first area 1041 and the second area 1042, and it can also partially correspond to the area between the first area 1041 and the second area 1042, as long as a width of the hollow area 1021 satisfying a space for line breakage repair is ensured, which will be specifically described as follows.

In one embodiment, referring again to FIG. 1 and FIG. 2, the hollow area 1021 completely corresponds to the area between the first area 1041 and the second area 1042. Specifically, one side of a vertical projection of the first area 1041 on the substrate 101 close to the second area 1042 coincides with one side of a vertical projection of the hollow area 1021 on the substrate 101 close to the first area 1041, and one side of a vertical projection of the second area 1042 on the substrate 101 close to the first area 1041 coincides with one side of a vertical projection of the hollow area 1021 on the substrate 101 close to the second area 1042. Using this kind of structure, for the gate insulation layer 103 disposed corresponding to the area between the first area 1041 and the second area 1042, because the first metal layer 102 does not exist at this area, even if there is a defect point at any position of the area, it does not cause a short circuit between the first metal layer 102 and the second metal layer 105, decreasing probability of dysfunctionality and increasing yield.

Figure 3:
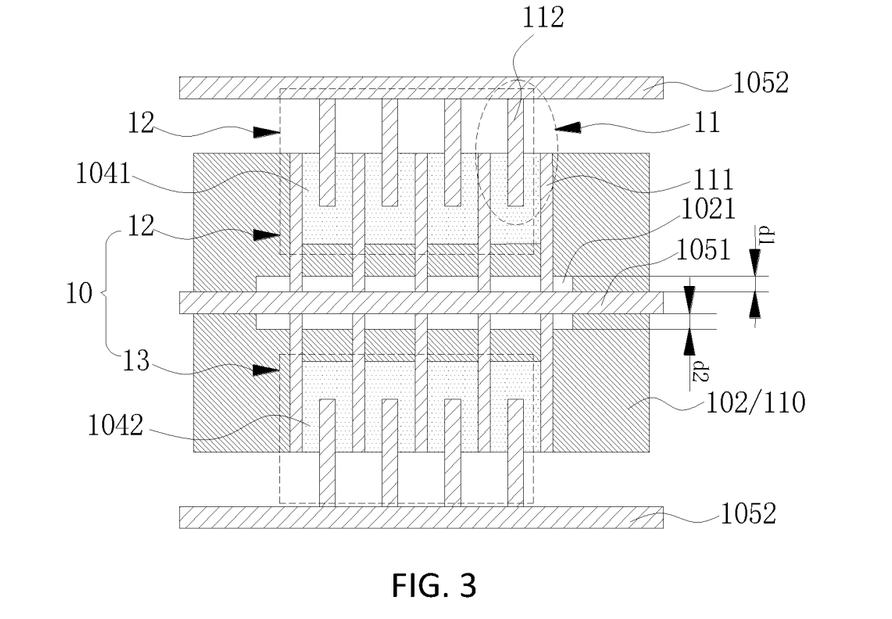
FIG. 3 is a top view of the array substrate according to a second embodiment of the present application.
Figure 4:
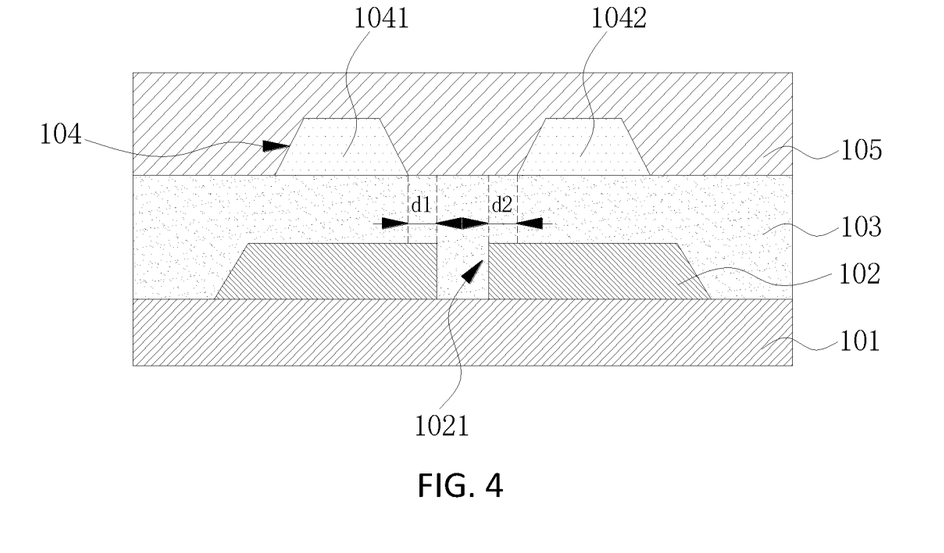
FIG. 4 is a sectional view of the array substrate according to the second embodiment of the present application.

In another embodiment, referring to FIG. 3 and FIG. 4, difference between FIG. 3 and FIG. 4, and FIG. 1 and FIG. 2 is that the hollow area 1021 partially corresponds to the area between the first area 1041 and the second area 1042. Specifically, there is a first gap d1 between one side of a vertical projection of the first connection wiring 1051 on the substrate 101 close to the first area 1041 and one side of a vertical projection of the hollow area 1021 on the substrate 101 close to the first area 1041, and there is a second gap d2 between one side of a vertical projection of the first connection wiring 1051 on the substrate 101 close to the second area 1042 and one side of a vertical projection of the hollow area 1021 on the substrate 101 close to the second area 1042. Using this kind of structure, in comparison with the above-described embodiment, an area of the vertical projection of the hollow area 1021 on the substrate 101 is decreased, thereby alleviating effects of the hollow area 1021 on current.

Specifically, a range of the first gap d1 is 4 um-6 um, and a range of the second gap d2 is 4 um-6 um.

Figure 5:
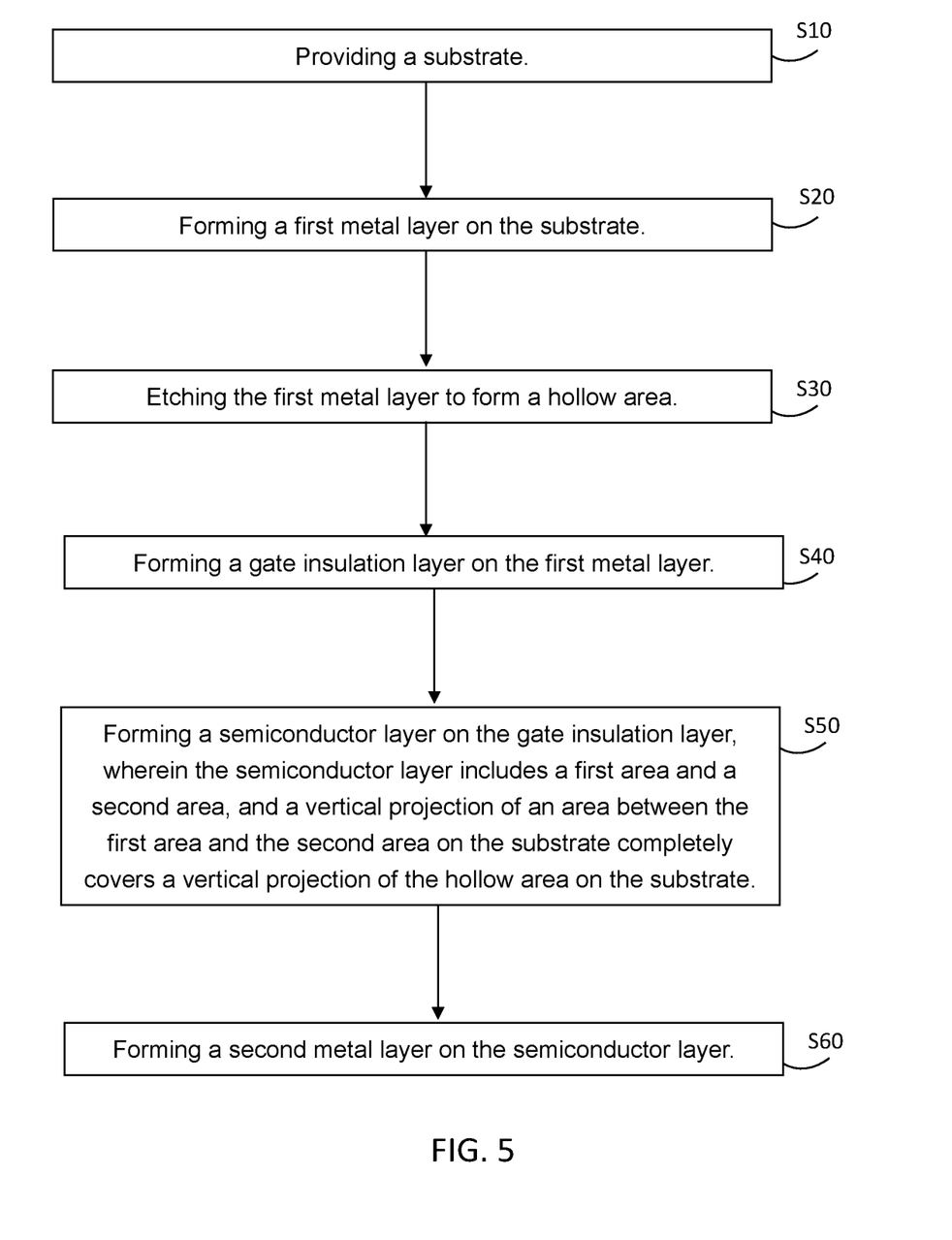
FIG. 5 is a flowchart of a manufacturing method of an array substrate according to an embodiment of the present application.

Referring to FIG. 5, the present application further provides a manufacturing method of an array substrate, the array substrate includes at least one switch unit 10, each of the switch unit 10 includes a plurality of TFTs 11 in parallel, each of the switch unit 10 includes at least two columns of a first TFT set 12 and at least two columns of a second TFT set 13, and the method includes following steps:

S10: providing a substrate 101.

Figure 5A:
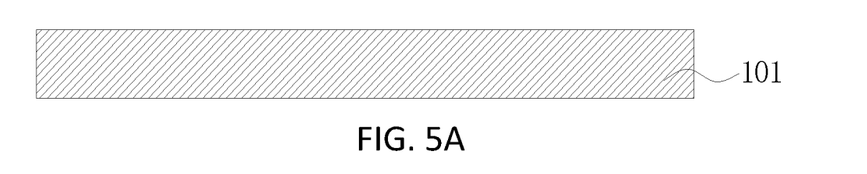
FIG. 5A-FIG. 5G are flowcharts of the manufacturing method of the array substrate according to an embodiment of the present application.

Specifically, referring to FIG. 5A, the substrate 101 can be a glass substrate or substrates of other materials, such as a flexible substrate, a plastic substrate, etc.

S20: forming a first metal layer 102 on the substrate 101.

Figure 5B:
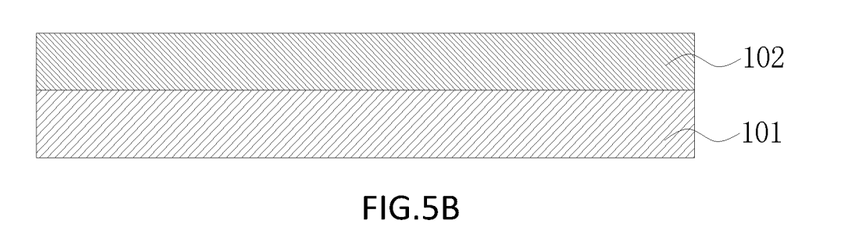

Specifically, referring to FIG. 5B, the first metal layer 102 covers the substrate 101. The first metal layer 102 can be manufactured through deposition, coating, or sputtering, and a material of the first metal layer 102 can include one or more of copper, tungsten, chromium, and aluminum. In the present embodiment, the first metal layer 102 at least includes a gate 110 of the TFTs 11.

S30: etching the first metal layer 102 to form a hollow area 1021.

Specifically, step S30 includes following steps:

S301: forming a photoresist layer 106 on the first metal layer 102;

S302: performing exposure and development to the photoresist layer 106; and S303: performing etching to the first metal layer 102 to form the hollow area 1021.

Figure 5C:
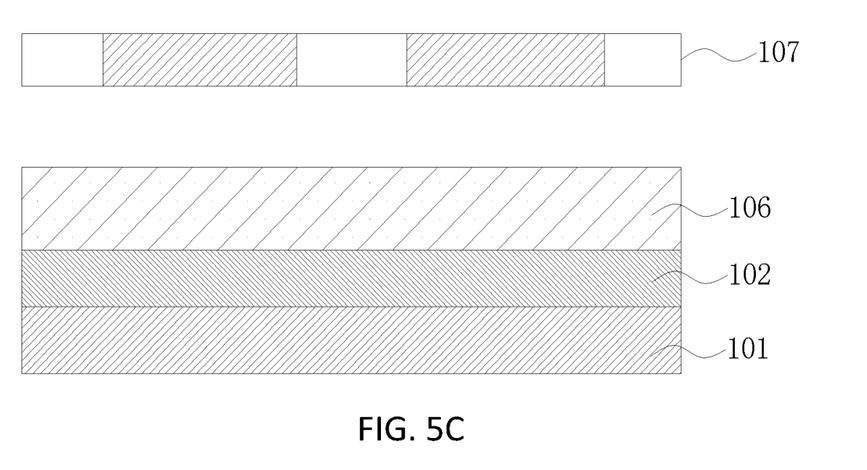
Figure 5D:
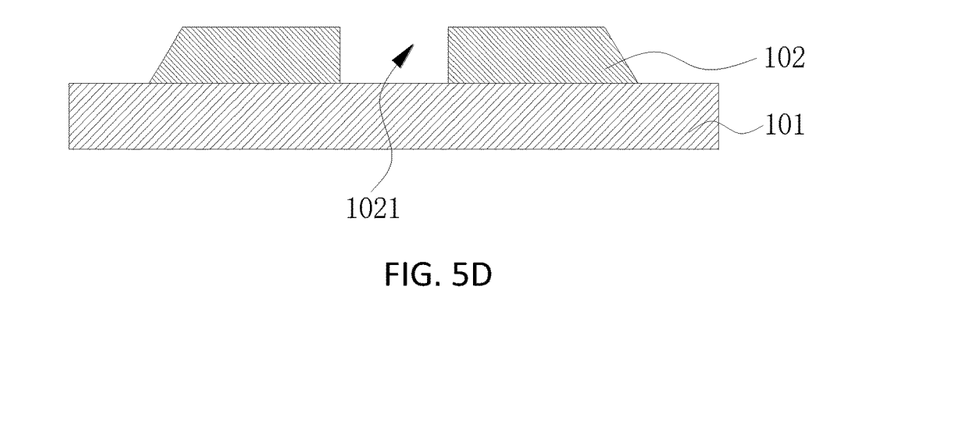

Specifically, referring to FIG. 5C and FIG. 5D, the photoresist layer 106 can be a positive photoresist layer or a negative photoresist layer. By disposing a mask 107 above the photoresist layer 106, the photoresist layer 106 is exposed and then developed, thereby removing part of the photoresist layer 106 to pattern the photoresist layer 106, facilitating following etching of the first metal layer 102 to pattern the first metal layer 102, to form the hollow area 1021. The mask 107 can be a half tone mask.

S40: forming a gate insulation layer on the first metal layer 102.

Figure 5E:
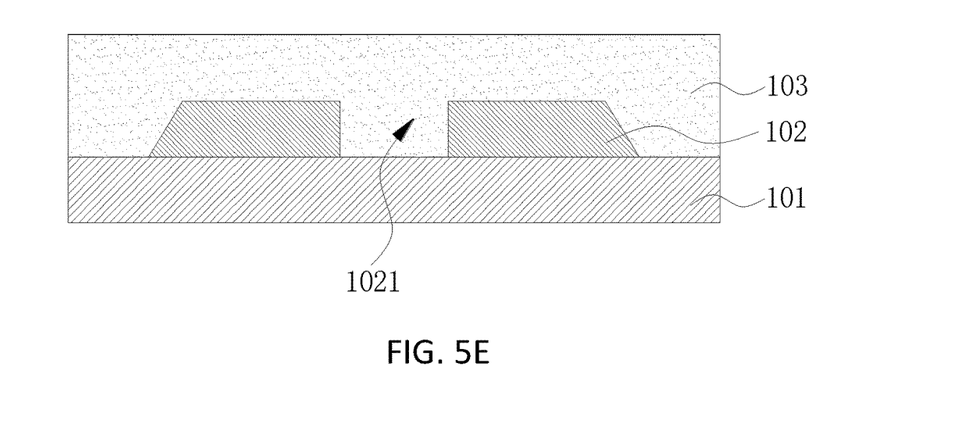

Specifically, referring to FIG. 5E, the gate insulation layer 103 can be manufactured through deposition, coating, or sputtering, the gate insulation layer 103 covers the first metal layer 102 and the substrate 101, and the gate insulation layer 103 is filled in the hollow area 1021. A material of the gate insulation layer 103 can include one or more of silica, silicon nitride, silicon oxynitride, and alumina.

S50: forming a semiconductor layer 104 on the gate insulation layer 103, wherein the semiconductor layer 104 includes a first area 1041 and a second area 1042, and a vertical projection of an area between the first area 1041 and the second area 1042 on the substrate 101 completely covers a vertical projection of the hollow area 1021 on the substrate 101.

Figure 5F:
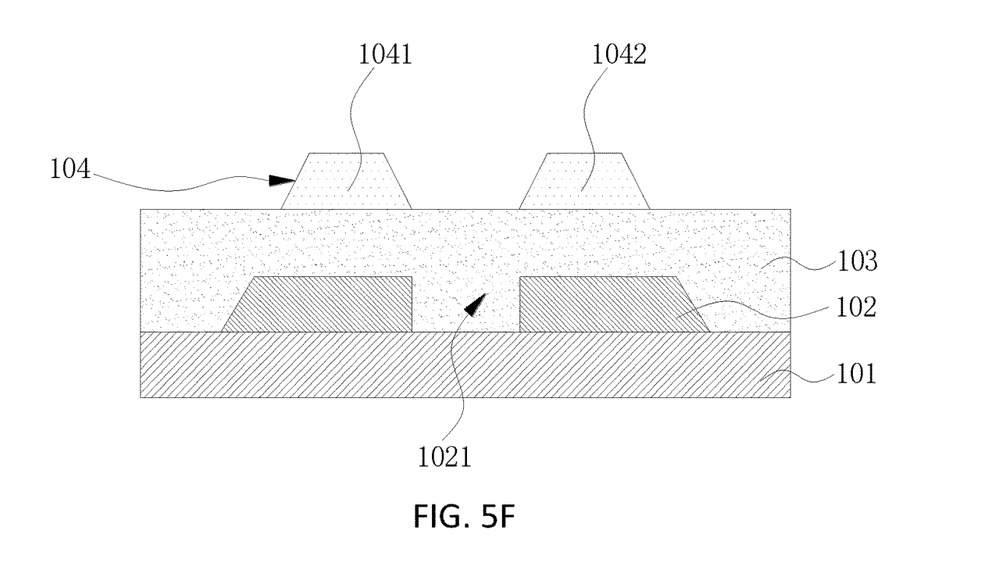

Specifically, referring to FIG. 5F, first, an amorphous silicon layer or an oxide layer can be formed on the gate insulation layer 103 through deposition, coating, or sputtering. Then, the amorphous silicon layer or the oxide layer is patterned through a photolithography process to form the semiconductor layer 104.

S60: forming a second metal layer 105 on the semiconductor layer 104.

Figure 5G:
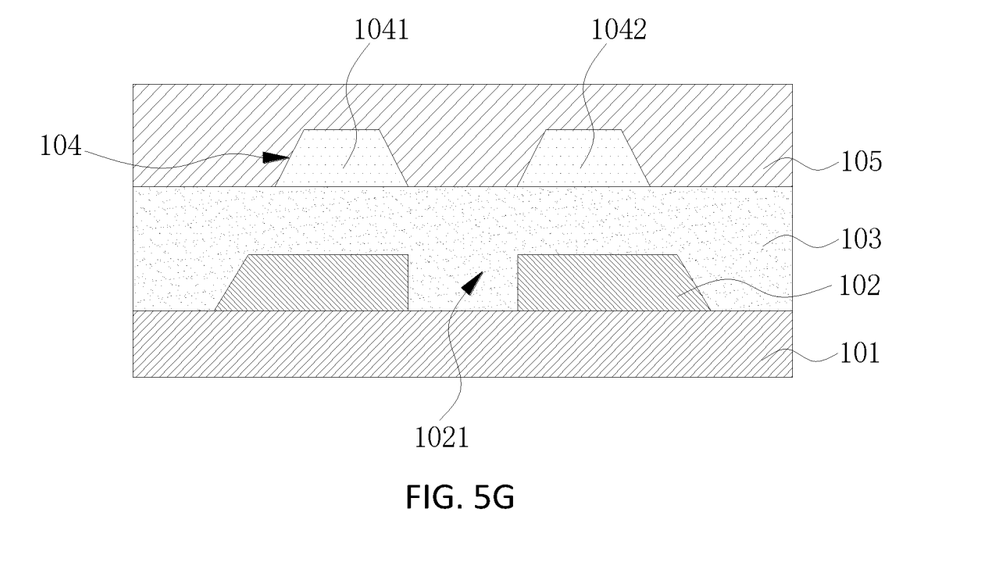

Specifically, referring to FIG. 5G, the second metal layer 105 can be formed on the gate insulation layer 103 through deposition, coating, or sputtering, a material of the second metal layer 105 can include one or more of copper, tungsten, chromium, and aluminum, and the material of the first metal layer 102 and the second metal layer 105 can be same or different. The second metal layer 105 is patterned to form a source 111 of the TFTs 11, a drain 112 of the TFTs 11, a first connection wiring 1051, and a second connection wiring 1052.

Wherein, the first metal layer 102, the gate insulation layer 103, the semiconductor layer 104, and the second metal layer 105 together become at least one switch unit 10, each of the switch unit 10 includes a plurality of TFTs 11 in parallel, and each of the switch unit 10 includes at least two columns of a first TFT set 12 and at least two columns of a second TFT set 13. The first area 1041 is disposed corresponding to the first TFT set 12, and the second area 1042 is disposed corresponding to the second TFT set 13. The source 111 of the plurality of TFTs 11 of the first TFT set 12 is connected through the first connection wiring 1051, and the drain of the plurality of TFTs 11 of the second TFT set 13 is connected through the second connection wiring 1052, so that the plurality of TFTs 11 of the switch unit 10 realize a parallel connection.

Figure 6:
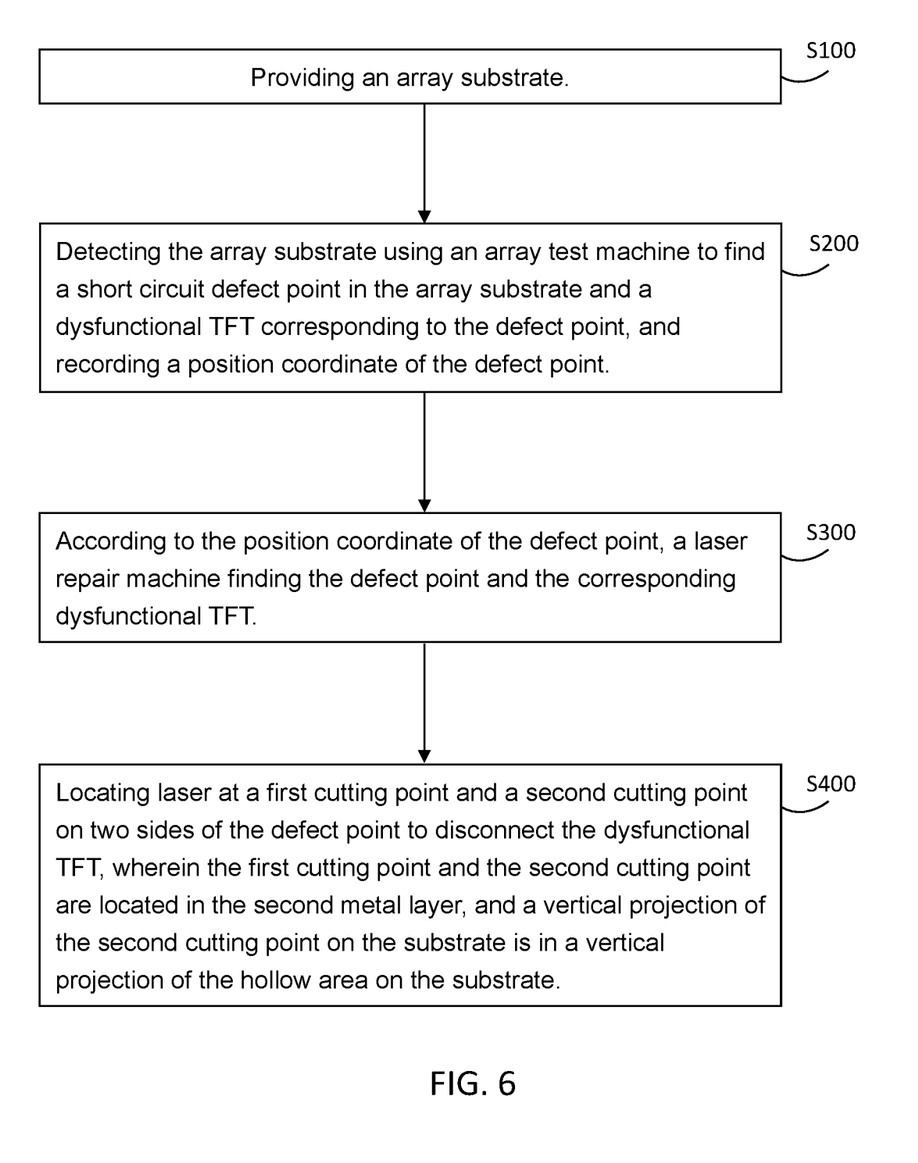
FIG. 6 is a flowchart of an array substrate short circuit repair method according to an embodiment of the present application.

Referring to FIG. 6, embodiments of the present application further provide a short circuit repair method of an array substrate including following steps:

S100: providing the above-described array substrate;

S200: detecting the array substrate using an array test machine to find a short circuit defect point in the array substrate and a dysfunctional TFT corresponding to the defect point, and recording a position coordinate of the defect point;

S300: according to the position coordinate of the defect point, a laser repair machine finding the defect point and the corresponding dysfunctional TFT; and S400: locating laser at a first cutting point Q1 and a second cutting point Q2 on two sides of the defect point to disconnect the dysfunctional TFT, wherein the first cutting point Q1 and the second cutting point Q2 are located in the second metal layer 105, and a vertical projection of the second cutting point Q2 on the substrate 101 is in a vertical projection of the hollow area 1021 on the substrate 101.

Specifically, the position coordinate of the defect point can be recorded in a repair system for the laser repair machine to obtain the position coordinate of the corresponding defect point from the repair system.

Figure 7:
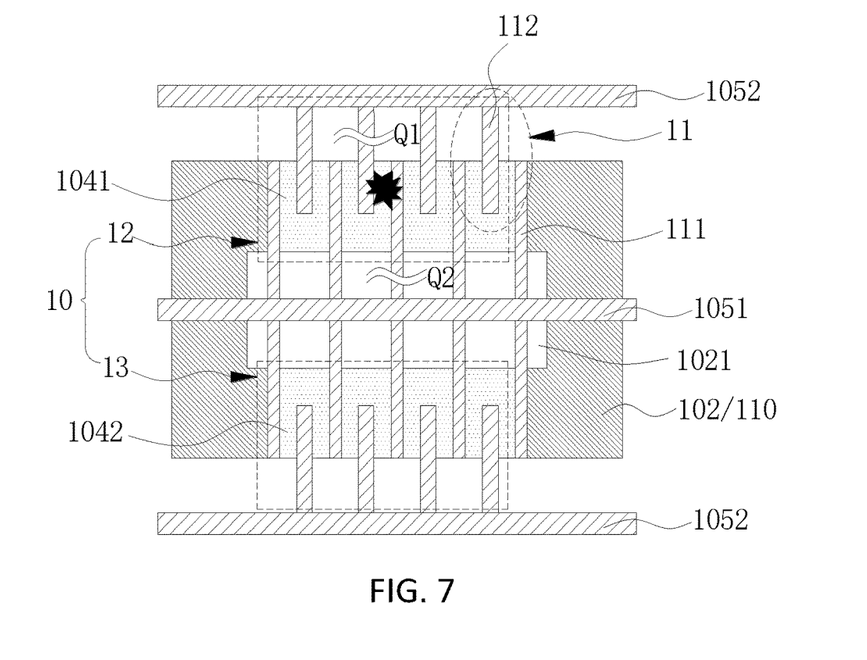
FIG. 7 is a schematic diagram of the array substrate short circuit repair method according to a first embodiment of the present application.

It should be explained that a defect point is produced at random positions in the switch unit 10, but it can be categorized into two situations, i.e., a defect cutting point is located in the semiconductor layer 104 and the gate insulation layer 103, and/or the defect cutting point is located in the gate insulation layer 103. Specific repair processes for defect points at different positions are described in detail as follows:

Referring to FIG. 7, the defect point is located in the semiconductor layer 104 and the gate insulation layer 103, causing a corresponding TFT 11 to be dysfunctional. In this situation, the laser repair machine removes the second metal layer 105 on two sides of the dysfunctional TFT 11 through laser to disconnect the dysfunctional TFT 11 from other normal TFTs 11, thereby realizing repairment. Specifically, a position of the laser includes a first cutting point Q1 and a second cutting point Q2 on two sides of the defect point, the first cutting point Q1 and the second cutting point Q2 are located in the second metal layer 105, and a vertical projection of the second cutting point Q2 on the substrate 101 is in a vertical projection of the hollow area 1021 on the substrate 101.

Specifically, a vertical projection of the first cutting point Q1 on the substrate 101 does not coincide with a vertical projection of the first metal layer 102 on the substrate 101. The first cutting point Q1 can be located in the drain 112 of the dysfunctional TFT 11, the second cutting point Q2 at the source 111 of the dysfunctional TFT 11, wherein the vertical projection of the second cutting point Q2 on the substrate 101 is in the vertical projection of the hollow area 1021 on the substrate 101.

Figure 8:
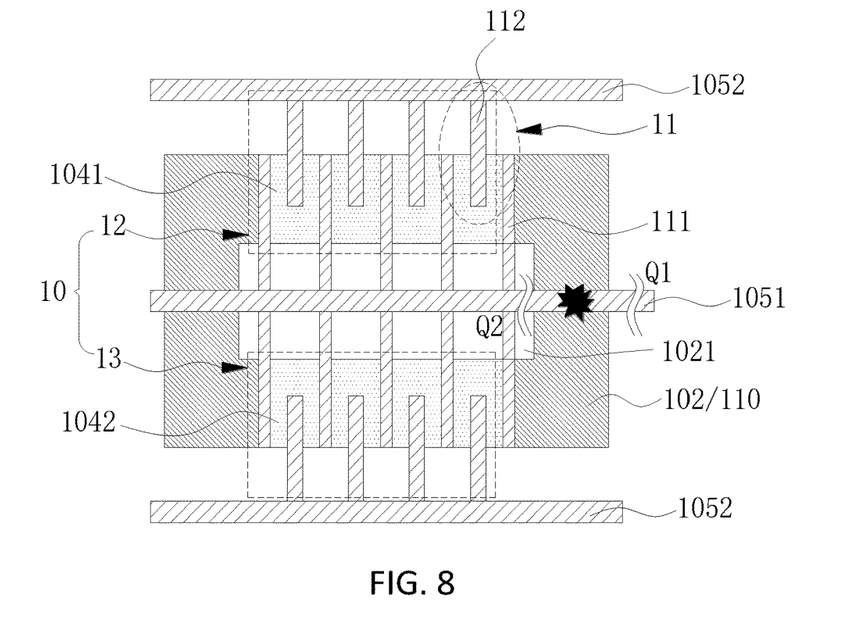
FIG. 8 is a schematic diagram of the array substrate short circuit repair method according to a second embodiment of the present application.

Referring to FIG. 8, the defect cutting point is in the gate insulation layer 103. For example, the defect point causes a short circuit between the first connection wiring 1051 and the first metal layer 102. In this situation, the laser repair machine removes the first connection wiring 1051 on two sides of the defect point through laser to disconnect part of the first connection wiring 1051 from rest of the first connection wiring 1051 connecting to the source 111 of the TFTs 11, thereby realizing repairment. Specifically, a position of the laser includes a first cutting point Q1 and a second cutting point Q2, and the first cutting point Q1 and the second cutting point Q2 are located on the first connection wiring 1051. The first cutting point Q1 can be located on one side of the defect point away from the first metal layer 102, the second cutting point Q2 at one side of the defect point close to the first metal layer 102, wherein a vertical projection of the second cutting point Q2 on the substrate 101 is in a vertical projection of the hollow area 1021 on the substrate 101.

Beneficial effects are that the array substrate, manufacturing method thereof, and short circuit repair method according to embodiments of the present application, through defining a hollow area in a first metal layer, wherein a semiconductor layer includes a first area corresponding to a first TFT set and a second area corresponding to a second TFT set, and the hollow area is disposed at least corresponding to part of an area between the first area and the second area, when there is a short circuit between the first metal layer and a second metal layer, because there is no first metal layer at the hollow area, laser can disconnect part of the second metal layer on two sides of a short circuit defect point through the hollow area from under the first metal layer, the short circuit defect point between the first metal layer and the second metal layer can be repaired, and an entire switch unit can continue to work, thereby alleviating loss of yield. In summary, although advantageous embodiments of the present application are disclosed above, the above-described advantageous embodiments are not intended to limit the present application. A person of ordinary skill in the art, without departing from sprit and scope of the present application, can make various changes and modifications, and therefore protection scope of the present application is based on what is claimed.

What is claimed is:

1. An array substrate, comprising a substrate and at least one switch unit disposed on the substrate, wherein each of the switch unit comprises a plurality of thin film transistors (TFTs) in parallel, and each of the switch unit comprises at least two columns of a first TFT set and at least two columns of a second TFT set;

wherein a first metal layer, a gate insulation layer, a semiconductor layer, and a second metal layer are sequentially disposed on the substrate, a hollow area is defined in the first metal layer, the semiconductor layer comprises a first area corresponding to the first TFT set and a second area corresponding to the second TFT set, and a vertical projection of an area between the first area and the second area on the substrate completely covers a vertical projection of the hollow area on the substrate.

2. The array substrate as claimed in claim 1, wherein the first metal layer comprises at least a gate of the TFTs, and the second metal layer comprises at least a first connection wiring, a second connection wiring, a source of the TFTs, and a drain of the TFTs;

wherein the source of the plurality of TFTs of the first TFT set is connected through the first connection wiring, and the drain of the plurality of TFTs of the second TFT set is connected through the second connection wiring.

3. The array substrate as claimed in claim 2, wherein there is a first gap between one side of a vertical projection of the first connection wiring on the substrate close to the first area and one side of a vertical projection of the hollow area on the substrate close to the first area;

wherein there is a second gap between one side of a vertical projection of the first connection wiring on the substrate close to the second area and one side of a vertical projection of the hollow area on the substrate close to the second area.

4. The array substrate as claimed in claim 3, wherein a range of the first gap is 4 μm-6 μm, and a range of the second gap is 4 um-6 um.

5. The array substrate as claimed in claim 1, wherein one side of a vertical projection of the first area on the substrate close to the second area coincides with one side of a vertical projection of the hollow area on the substrate close to the first area;
   wherein one side of a vertical projection of the second area on the substrate close to the first area coincides with one side of a vertical projection of the hollow area on the substrate close to the second area.

6. The array substrate as claimed in claim 1, wherein the gate insulation layer is filled in the hollow area.

7. A manufacturing method of an array substrate, comprising following steps:
   providing a substrate;
   forming a first metal layer on the substrate;
   etching the first metal layer to form a hollow area;
   forming a gate insulation layer on the first metal layer;
   forming a semiconductor layer on the gate insulation layer, wherein the semiconductor layer comprises a first area and a second area, and a vertical projection of an area between the first area and the second area on the substrate completely covers a vertical projection of the hollow area on the substrate; and
   forming a second metal layer on the semiconductor layer;
   wherein the first metal layer, the gate insulation layer, the semiconductor layer, and the second metal layer together become at least one switch unit, each of the switch unit comprises a plurality of thin film transistors (TFTs) in parallel, and each of the switch unit comprises at least two columns of a first TFT set and at least two columns of a second TFT set.

8. The manufacturing method of the array substrate as claimed in claim 7, wherein etching the first metal layer to form the hollow area comprises following steps:
   forming a photoresist layer on the first metal layer;
   performing exposure and development to the photoresist layer; and
   performing etching to the first metal layer to form the hollow area.

9. The manufacturing method of the array substrate as claimed in claim 7, wherein the first metal layer comprises at least a gate of the TFTs, and the second metal layer comprises at least a first connection wiring, a second connection wiring, a source of the TFTs, and a drain of the TFTs;
   wherein the source of the plurality of TFTs of the first TFT set is connected through the first connection wiring, and the drain of the plurality of TFTs of the second TFT set is connected through the second connection wiring.

10. The manufacturing method of the array substrate as claimed in claim 9, wherein there is a first gap between one side of a vertical projection of the first connection wiring on the substrate close to the first area and one side of a vertical projection of the hollow area on the substrate close to the first area;
    wherein there is a second gap between one side of a vertical projection of the first connection wiring on the substrate close to the second area and one side of a vertical projection of the hollow area on the substrate close to the second area.

11. The manufacturing method of the array substrate as claimed in claim 10, wherein a range of the first gap is 4 um-6 um, and a range of the second gap is 4 μm-6 μm.

12. The manufacturing method of the array substrate as claimed in claim 7, wherein one side of a vertical projection of the first area on the substrate close to the second area coincides with one side of a vertical projection of the hollow area on the substrate close to the first area;
    wherein one side of a vertical projection of the second area on the substrate close to the first area coincides with one side of a vertical projection of the hollow area on the substrate close to the second area.

13. The manufacturing method of the array substrate as claimed in claim 7, wherein the gate insulation layer is filled in the hollow area.

14. A short circuit repair method of an array substrate, comprising following steps:
    providing the array substrate, wherein the array substrate comprises a substrate and at least one switch unit disposed on the substrate, wherein each of the switch unit comprises a plurality of thin film transistors (TFTs) in parallel, and each of the switch unit comprises at least two columns of a first TFT set and at least two columns of a second TFT set; wherein a first metal layer, a gate insulation layer, a semiconductor layer, and a second metal layer are sequentially disposed on the substrate, a hollow area is defined in the first metal layer, the semiconductor layer comprises a first area corresponding to the first TFT set and a second area corresponding to the second TFT set, and a vertical projection of an area between the first area and the second area on the substrate completely covers a vertical projection of the hollow area on the substrate;
    detecting the array substrate using an array test machine to find a short circuit defect point in the array substrate and a dysfunctional TFT corresponding to the defect point, and recording a position coordinate of the defect point;
    according to the position coordinate of the defect point, a laser repair machine finding the defect point and the corresponding dysfunctional TFT; and
    locating laser at a first cutting point and a second cutting point on two sides of the defect point to disconnect the dysfunctional TFT, wherein the first cutting point and the second cutting point are located in the second metal layer, and a vertical projection of the second cutting point on the substrate is in the vertical projection of the hollow area on the substrate.

15. The short circuit repair method of the array substrate as claimed in claim 14, wherein a vertical projection of the first cutting point on the substrate does not coincide with a vertical projection of the first metal layer on the substrate.

16. The short circuit repair method of the array substrate as claimed in claim 14, wherein the first metal layer comprises at least a gate of the TFTs, and the second metal layer comprises at least a first connection wiring, a second connection wiring, a source of the TFTs, and a drain of the TFTs;
    wherein the source of the plurality of TFTs of the first TFT set is connected through the first connection wiring, and the drain of the plurality of TFTs of the second TFT set is connected through the second connection wiring.

17. The short circuit repair method of the array substrate as claimed in claim 16, wherein there is a first gap between one side of a vertical projection of the first connection wiring on the substrate close to the first area and one side of a vertical projection of the hollow area on the substrate close to the first area;
    wherein there is a second gap between one side of a vertical projection of the first connection wiring on the substrate close to the second area and one side of a vertical projection of the hollow area on the substrate close to the second area.

18. The short circuit repair method of the array substrate as claimed in claim 17, wherein a range of the first gap is 4 um-6 um, and a range of the second gap is 4 μm-6 μm.

19. The short circuit repair method of the array substrate as claimed in claim 14, wherein one side of a vertical projection of the first area on the substrate close to the second area coincides with one side of a vertical projection of the hollow area on the substrate close to the first area;
   wherein one side of a vertical projection of the second area on the substrate close to the first area coincides with one side of a vertical projection of the hollow area on the substrate close to the second area.

20. The short circuit repair method of the array substrate as claimed in claim 14, wherein the gate insulation layer is filled in the hollow area.

\* \* \* \* \*